United States Patent
Li et al.

(10) Patent No.: US 6,324,756 B1
(45) Date of Patent: *Dec. 4, 2001

(54) METHOD AND SYSTEM FOR SEALING THE EDGE OF A PBGA PACKAGE

(75) Inventors: Xia Li, Fremont; Ranji Gannamani, Santa Clara, both of CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/208,825

(22) Filed: Dec. 9, 1998

(51) Int. Cl.[7] ....................................................... H05K 3/30
(52) U.S. Cl. .............................. 29/841; 29/830; 29/831; 29/827; 257/707; 257/706
(58) Field of Search ............................. 29/837, 830, 846, 29/841, 843, 847, 850, 853; 174/263, 267, 261, 254; 257/780, 737, 738, 711, 730, 777, 778, 706, 707, 784, 773

(56) References Cited

U.S. PATENT DOCUMENTS

| | | | | |
|---|---|---|---|---|
| 4,090,231 | * | 5/1978 | Millard ................................. | 361/433 |
| 5,599,630 | * | 2/1997 | Smith et al. ......................... | 428/413 |
| 5,717,252 | * | 2/1998 | Nakashima et al. ................. | 257/707 |
| 5,787,569 | * | 8/1998 | Lotfi et al. .......................... | 29/602.1 |
| 5,890,284 | * | 4/1999 | Chartrand .............................. | 29/853 |
| 5,892,417 | * | 4/1999 | Johnson et al. ..................... | 333/193 |

* cited by examiner

Primary Examiner—Lee Young
Assistant Examiner—Sean Smith
(74) Attorney, Agent, or Firm—Sawyer Law Group LLP

(57) ABSTRACT

A system and method for providing plastic ball grid array ("PBGA") packages is disclosed. In one aspect, the method and system provide a plurality of PBGA packages. Each of the plurality of PBGA packages including a semiconductor die and a portion of a substrate. The semiconductor die is electrically coupled to the portion of the substrate. The portion of the substrate has an edge. In this aspect, the method and system include forming the plurality of PBGA packages on the substrate and separating the portion of the substrate for each of the plurality of PBGA packages. The portion of the substrate for one of the plurality of PBGA packages is separated from the portion of the substrate for another of the plurality of PBGA packages by a gap. In a preferred embodiment, the gap is created by punching the substrate. The method and system further include filling the gap with a moisture sealant and cutting the moisture sealant to separate the plurality of PBGA packages. The edge of the portion of the substrate for each of the plurality of PBGA packages is substantially covered by the moisture sealant. In another aspect, the method and system include providing a semiconductor die, a substrate having an edge, and a moisture sealant. The semiconductor die is electrically coupled to the substrate. The substrate has an edge. The moisture sealant substantially covers the edge of the substrate.

5 Claims, 4 Drawing Sheets

METHOD AND SYSTEM FOR SEALING THE EDGE OF A PBGA PACKAGE

FIELD OF THE INVENTION

The present invention relates to plastic ball grid array packages and more particularly to a method and system for sealing the edges of the substrate of the packages, thereby providing improved reliability and performance of the package.

BACKGROUND OF THE INVENTION

Conventional plastic ball grid array ("PBGA") packages are used in a variety of semiconductor applications. Both micro-BGA and PBGA packages are currently available. Conventional micro-BGA packages are chip-scale packages. As their name suggests, conventional micro-BGA packages are significantly smaller than PBGA packages.

Conventional micro-BGA packages are formed on a tape substrate. Semiconductor dies are attached to the tape. Electrical connection is made between the dies and metal traces within the tape. The gaps between semiconductor dies are then filled with an adhesive encapsulant. The adhesive encapsulant aids in sealing and protecting the edges of the die. The tape is then cut between the dies, forming micro-BGA packages.

Conventional PBGA packages are significantly larger than conventional micro-BGA packages. Because of the difference in size, conventional PBGA packages are typically manufactured using very different processes and materials than micro-BGA packages. The conventional PBGA package includes a semiconductor die attached to a substrate. However, the substrate is similar to a printed circuit board. Typically, the substrate used is a BT (Bismaliemide Triazine) substrate. The substrate not only provides a relatively stiff surface to which the semiconductor die can be attached but also electrically couples the die to the solder balls. Consequently, the substrate includes conductive traces with insulating layers interspersed between the conductive traces.

Contacts on the semiconductor die are typically electrically coupled to the metallic traces in the substrate through wires bonded to a contact on the surface of the substrate. The semiconductor die is also typically covered in a molding compound, such as an epoxy. The molding compound aids in protecting the die from the environment and contributes to the robustness of the package. Solder balls on a side of the substrate opposite to the die can electrically connect the PBGA package to another circuit.

Typically, conventional PBGA packages are formed by attaching a number of dies to a long strip of substrate that is designed to accommodate the dies. The dies are then electrically coupled and molded to the substrate. After the PBGA packages are substantially formed, the substrate is cut to separate the conventional PBGA packages. The conventional PBGA packages may then be used in other circuits.

Although conventional PBGA packages are useful for many applications, the PBGA package may be prone to failure. For example, moisture may enter the substrate, and adversely affect the reliability of the PBGA package.

Accordingly, what is needed is a system and method for improving the reliability of the substrate in a PBGA package. The present invention addresses such a need.

SUMMARY OF THE INVENTION

The present invention comprises a system and method for providing plastic ball grid array ("PBGA") packages. In one aspect, the method and system provide a plurality of PBGA packages. Each of the plurality of PBGA packages includes a semiconductor die and a portion of a substrate. The semiconductor die is electrically coupled to the portion of the substrate. The portion of the substrate has an edge. In this aspect, the method and system comprise forming the plurality of PBGA packages on the substrate and separating the portion of the substrate for each of the plurality of PBGA packages. The portion of the substrate for one of the plurality of PBGA packages is separated from the portion of the substrate for another of the plurality of PBGA packages by a gap. This gap may be created by a punching or cutting process. The method and system further comprise filling the gap with a moisture sealant and sawing along the center of the gap (now filled with the moisture sealant) to separate the plurality of PBGA packages. The edge of the portion of the substrate for each of the plurality of PBGA packages is substantially covered by the moisture sealant. In another aspect, the method and system comprise providing a semiconductor die, a substrate having an edge, and a moisture sealant. The semiconductor die is electrically coupled to the substrate. The substrate has an edge. The moisture sealant substantially covers the edge of the substrate.

According to the system and method disclosed herein, the present invention seals the edge of the substrate of the PBGA packages, thereby increasing reliability of the PBGA package.

DETAILED DESCRIPTION OF THE INVENTION

The present invention relates to an improvement in semiconductor packages. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1A:
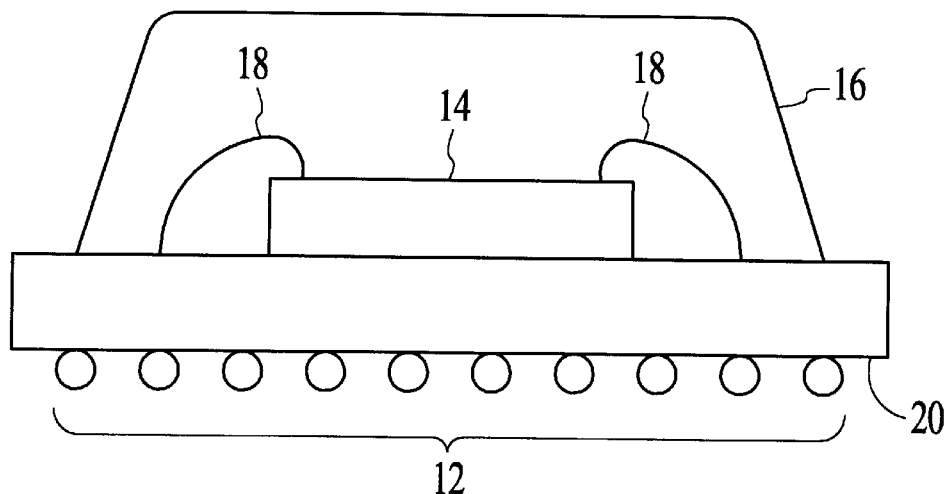
FIG. 1A is a diagram of a conventional PBGA package.

FIG. 1A is a diagram of a conventional plastic ball grid array ("PBGA") package 10. The conventional PBGA package 10 includes a semiconductor die 14, a substrate 20, wire bonds 18, a molding compound 16, and a plurality of solder balls 12. The semiconductor die 14 is electrically coupled to the substrate 20 through the wires 18. The molding compound 16 protects the die 14 from the environment. Although not shown, micro-BGA packages are also currently available. Conventional micro-BGA packages are significantly smaller than PBGA packages. For example, conventional PBGA packages are typically on the order of centimeters on each side. Conventional micro-BGA packages, however, are only slightly larger than the die itself.

Because of the difference in size, conventional PBGA packages are typically manufactured using very different processes and materials than micro-BGA packages. Conventional micro-BGA packages are formed on a tape substrate. Electrical connection is made between the dies and metal traces within the tape. The gaps between semiconductor dies are then filled with an adhesive encapsulant. The adhesive encapsulant aids in sealing and protecting the edges of the die. The tape is then cut between the dies, forming micro-BGA packages.

Figure 1B:
FIG. 1B is a diagram of an edge of a portion of the substrate for the conventional PBGA package.

In contrast, the substrate 20 of the conventional PBGA package 10 is similar to a printed circuit board. FIG. 1B depicts a cross sectional view of an edge of a portion of the substrate 20. The substrate 20 includes metal traces 21, 23, and 25. The substrate 20 also includes insulating layers 22, 24, 26, and 28. In a preferred embodiment, the insulating layers 22, 24, 26, and 28 are actually composed of polymer fibers in an epoxy. Also in a preferred embodiment, the metal traces 21, 23, and 25 are copper layers. Moreover, although not shown, there may be electrical connection made between one or more of the metal traces 21, 23, and 25 and another metal trace 21, 23, or 25, one or more of the solder balls 12, and the semiconductor die 14. The solder balls 12 are shown on the lower surface of the substrate 20. The metal traces 21, 23, and 25 provide electrical connection between the semiconductor die 14 and a portion of the solder balls 12.

Figure 2:
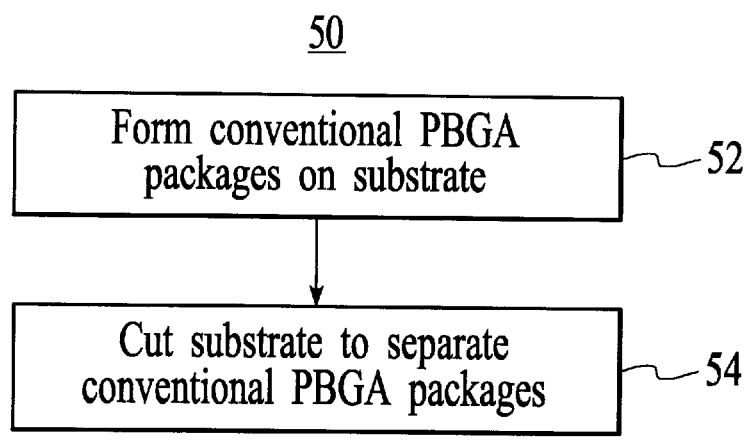
FIG. 2 is a flow chart depicting a conventional method for fabricating a conventional PBGA package.

FIG. 2 depicts a conventional method 50 for fabricating conventional PBGA packages 10. Several individual PBGA packages are formed on a single large substrate strip via step 52. Thus, several semiconductor dies 14 are affixed to the substrate 20 and electrically coupled to the substrate 20. The substrate 20 is then cut, via step 54. As a result, several individual PBGA packages 10 are fabricated.

Figure 3:
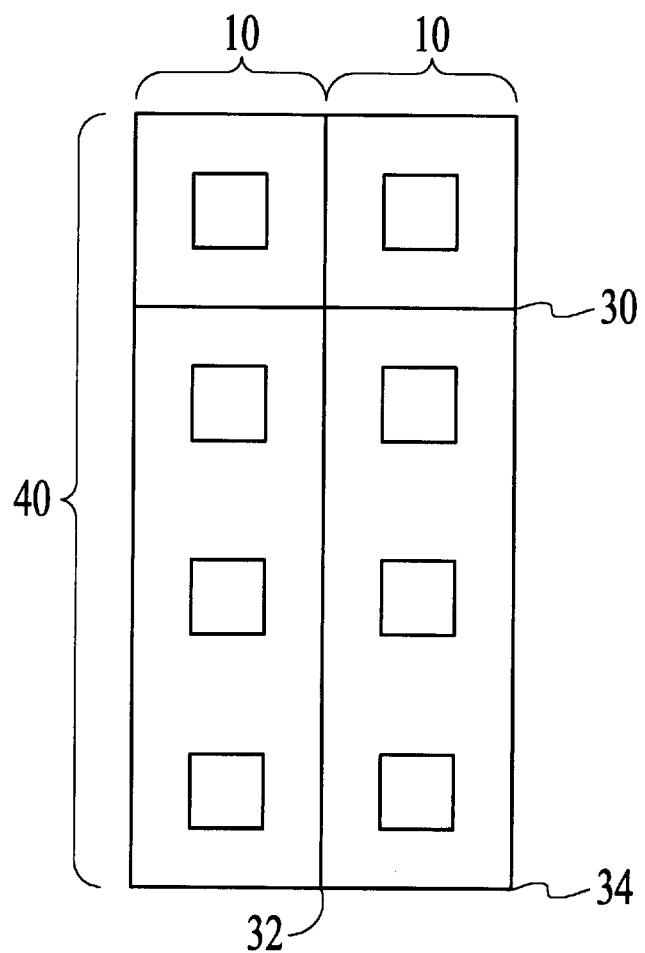
FIG. 3 is a diagram of a plurality of PBGA packages during fabrication.

Step 54 is depicted in FIG. 3. As depicted in FIG. 3, two cuts 30 and 32 have been made in the substrate strip 40. Thus, two conventional PBGA packages 10 have been separated from the substrate strip 40. Thus, the substrate 20 for each PBGA package 10 is a portion of the substrate strip 40 shown in FIG. 3.

Although the method 50 is capable of providing conventional PBGA packages 10, one of ordinary skill in the art will realize that conventional PBGA packages 10 can be unreliable. It has been determined that when the conventional PBGA package 10 is subjected to certain stress tests, the conventional PBGA package 10 fails. Substrates absorb moisture, which can lead to leakage failures, corrosion, delamination, and other problems. Referring back to FIG. 1B, it is hypothesized that failure of electrical connection through the substrate 20 could be due to corrosion and/or delamination of some of the metal traces 21, 23, or 25 within the substrate 20. It is also hypothesized that the moisture causing the corrosion and/or delamination of some of the metal traces 21, 23, or 25 enters through the edge of the substrate 20.

The substrate 20 includes metal traces 21, 23, and 25 as well as insulating layers 22, 24, 26, and 28. The layers are exposed at the edge of the substrate 20 after the cut is made in step 54 of the method 50. Moisture may penetrate the edge of the substrate 20 for each PBGA package 10. Because the substrate 20 includes metal traces 21, 23, and 25 and insulating layers 22, 24, 26, and 28 the penetration of moisture is enhanced. This is because moisture penetrates at a higher rate along a joint between two materials. As a result, moisture may penetrate into the substrate 20 and corrupt the performance of the conventional PBGA package 10.

The present invention provides for a method and system for providing plastic ball grid array ("PBGA") packages. In one aspect, the method and system provide a plurality of PBGA packages. Each of the plurality of PBGA packages includes a semiconductor die and a portion of a substrate. The semiconductor die is electrically coupled to the portion of the substrate. The portion of the substrate has an edge. In this aspect, the method and system comprise forming the plurality of PBGA packages on the substrate and cutting or punching the substrate to separate the portion of the substrate for each of the plurality of PBGA packages. This cutting or punching process creates gaps. The portion of the substrate for one of the plurality of PBGA packages is separated from the portion of the substrate for another of the plurality of PBGA packages by the gap. The method and system further comprise filling the gap with a moisture sealant and sawing along the center of the gap (now filled with moisture sealant) to separate the plurality of PBGA packages. The edge of the portion of the substrate for each of the plurality of PBGA packages is substantially covered by the moisture sealant. In another aspect, the method and system comprise providing a semiconductor die, a substrate having an edge, and a moisture sealant. The semiconductor die is electrically coupled to the substrate. The substrate has an edge. The moisture sealant substantially covers the edge of the substrate.

The present invention will be described in terms of a PBGA package using a particular substrate and a particular moisture sealant. However, one of ordinary skill in the art will readily recognize that this method and system will operate effectively for other types of substrates and other sealants.

Figure 4A:
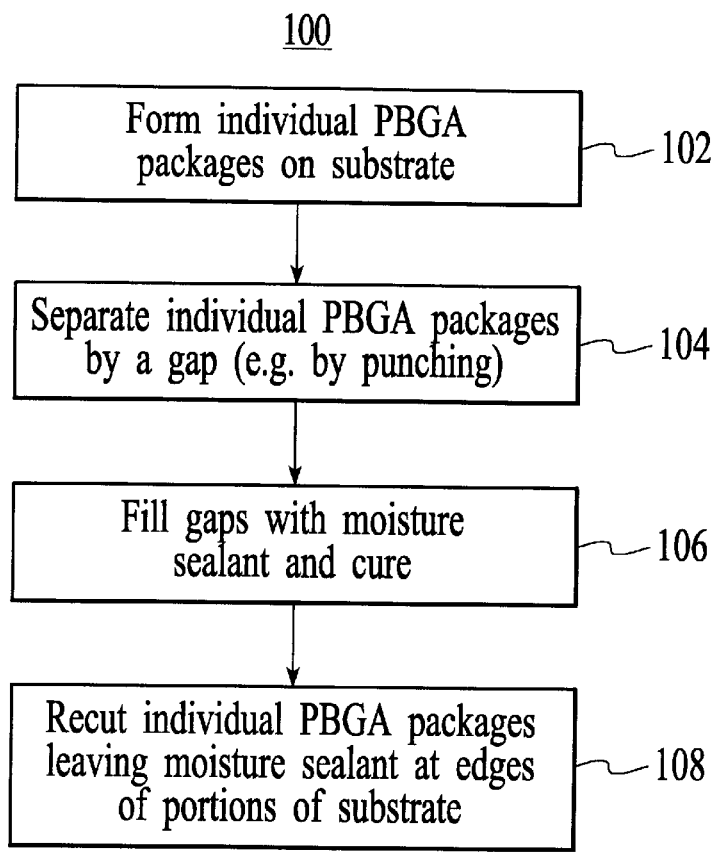
FIG. 4A is a flow chart depicting one embodiment of a method for providing PBGA packages in accordance with the present invention.
Figure 4B:
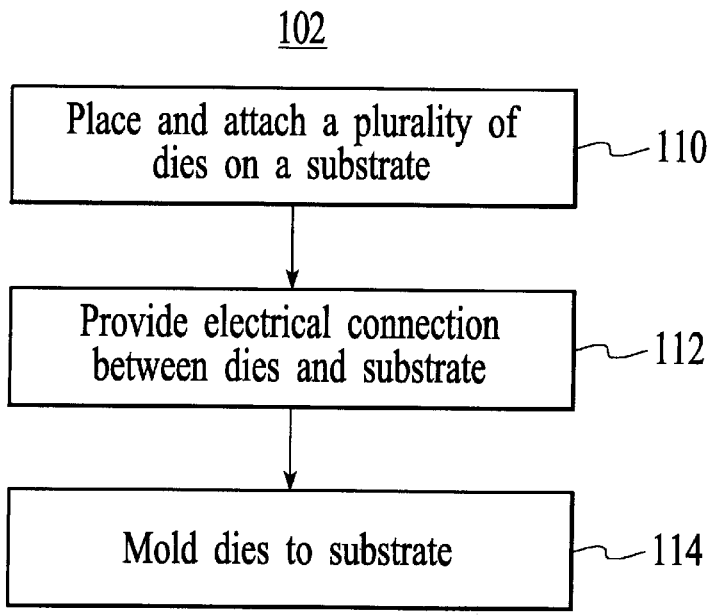
FIG. 4B is a flow chart depicting one embodiment of the step of forming a plurality of PBGA packages on the substrate.

To more particularly illustrate the method and system in accordance with the present invention, refer to FIG. 4A, which depicts one embodiment of a method 100 for providing a PBGA package in accordance with the present invention. Individual PBGA packages are substantially formed on a substrate via step 102. Preferably, the substrate used is similar to a printed circuit board. In one preferred embodiment, the substrate is BT (Bismaliemide Triazine). FIG. 4B depicts one embodiment of the step 102. In one embodiment, step 102 includes placing a plurality of semiconductor dies on the substrate and attaching the dies to the substrate, via step 110. Electrical connection is made between the semiconductor dies and the portion of the substrate to which each semiconductor die is attached, via step 112. In one embodiment, step 112 is performed by wirebonding contacts on each semiconductor die to contacts on the portion of the substrate on which the semiconductor die is placed. The semiconductor dies are then molded to the substrate, via step 114. Thus, the semiconductor dies are fixed to the substrate.

Figure 5:
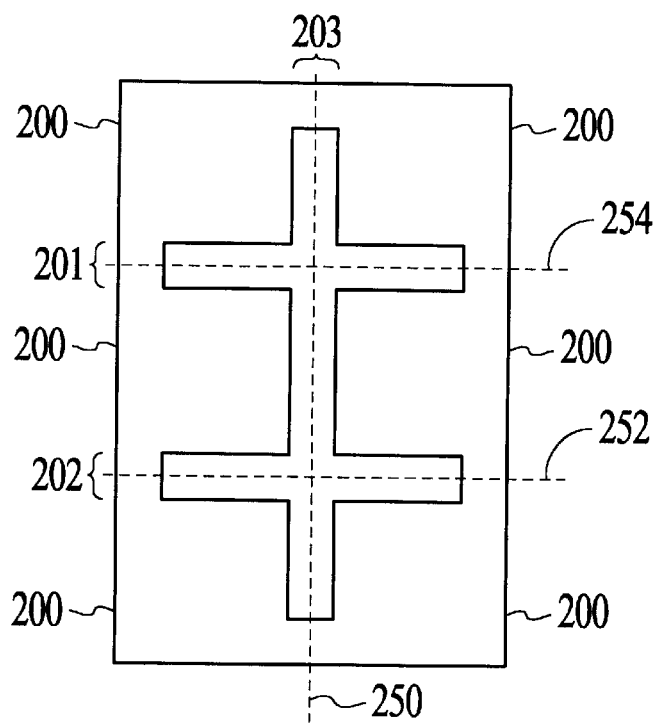
FIG. 5 is a diagram of a plurality of PBGA packages in accordance with the present invention after the substrate has been cut.

Referring back to FIG. 4A, once the PBGA packages have been substantially formed in step 102, the individual PBGA packages are substantially separated, via step 104. In a preferred embodiment, the substrate is punched in step 104. Punching the substrate in step 104 separates the individual PBGA packages except for small portions in two corners of each package. However, in an alternate embodiment, the substrate may be cut in step 104. Each PBGA package includes a portion of the substrate. After step 104 is performed, the edge of the portion of the substrate for one PBGA package is separated from the portion of the substrate for another PBGA packages by a gap. A substrate which has been punched is depicted in FIG. 5. The outer edge of each PBGA package 200 is the edge of the portion of the substrate for that PBGA package 200. The PBGA packages 200 are separated by gaps 201, 202, and 203 and connected at two corners. However, in an alternate embodiment, each PBGA package 200 is separate after step 104 is performed. Therefore, the PBGA packages 200 of the alternate embodiment are not connected at the corners.

Referring back to FIG. 4A, the gaps 201, 202, and 203 are then filled with an adhesive moisture sealant, via step 106. In a preferred embodiment, the moisture sealant is a liquid. Thus, step 106 may also include curing the adhesive moisture sealant so that the adhesive moisture sealant solidifies. In a preferred embodiment, the adhesive moisture sealant is baked in order to accelerate the curing process. Once the gaps are filled with the adhesive, then the PBGA packages are cut again, via step 108. However, the cut in step 108 is performed so that some adhesive remains at the edges of the PBGA packages. Thus, in a preferred embodiment, the cut in step 108 is performed substantially at the center of the gap to ensure that some of the adhesive moisture sealant remains at the edges of the PBGA packages. Referring to FIG. 5, the cut performed in step 108 is preferably performed along dashed lines 250, 252, and 254.

Figure 6:
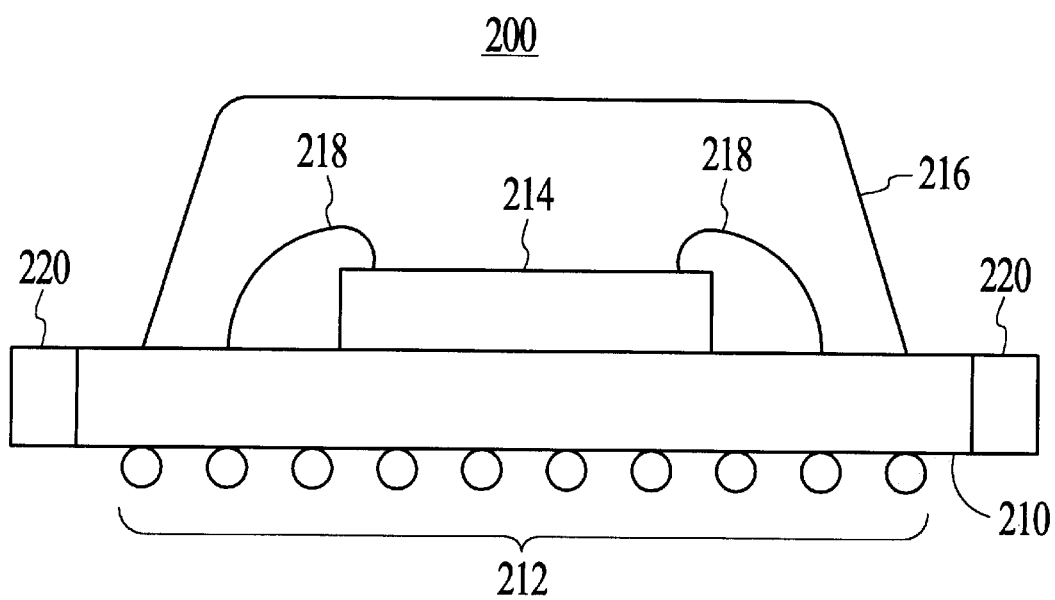
FIG. 6 is a diagram of a PBGA package in accordance with the present invention.

FIG. 6 depicts one embodiment of a PBGA package 200 in accordance with the present invention. The PBGA package 200 includes a semiconductor die 214 on a portion of the substrate 210. The portion of the substrate 210 was separated from the remainder of the substrate (not shown) in step 104. On an opposing surface, the portion of the substrate 210 is connected with a plurality of solder balls 212. The portion of the substrate 210 includes metal and insulating layers (not shown). The semiconductor die 214 is electrically coupled to the portion of the substrate 210 by wires 218. The semiconductor die 214 and wires 218 are surrounded by molding compound 216.

Because steps 106 and 108 have been performed, the PBGA package 200 also includes adhesive 220 at the edges of the portion of the substrate 210. The adhesive 220 seals the edges of the portion of the substrate 210. Consequently, the penetration of moisture into the substrate is greatly reduced. Corrosion and delamination of metal traces within the portion of the substrate 210 is also reduced. Reliability of the PBGA package 200 is, therefore, enhanced.

A method and system has been disclosed for providing a PBGA package having reduced penetration of moisture into the substrate. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A plastic ball grid array ("PBGA") package comprising:

a semiconductor die;

a substrate having an at least one side edge, a top surface, and a bottom surface, the semiconductor die being electrically coupled to and covering a portion of the top surface of the substrate;

a moisture sealant, the moisture sealant substantially covering only the side edge of the substrate; and molding compound substantially covering the semiconductor die and a remaining portion of the top surface of the substrate.

2. The PBGA package of claim 1 further comprising:

a plurality of solder balls connected to the bottom surface of the substrate.

3. The PBGA package of claim 1 wherein the PBGA package is provided by separating the substrate for the PBGA package from a plurality of substrates for a plurality of PBGA packages to form a gap between the PBGA package and the plurality of PBGA packages and wherein the moisture sealant is provided by filling the gap with a moisture sealant compound and cutting the moisture sealant compound to separate the plurality of PBGA packages so that the side edge of the substrate for the PBGA package is substantially covered by the moisture sealant.

4. The PBGA package of claim 3 wherein the substrate for the PBGA package is separated from the plurality of substrates by punching the substrate to separate the substrate from the plurality of substrates for the plurality of PBGA packages, the substrate for the PBGA package further including two corners, each of the two corners being connected to a corner of an adjacent substrate for an adjacent PBGA package of the plurality of packages.

5. The PBGA package of claim 1 wherein the moisture sealant covers substantially only the side edge of the substrate.

* * * * *